US008456226B2

(12) United States Patent
Au et al.

(10) Patent No.: US 8,456,226 B2
(45) Date of Patent: *Jun. 4, 2013

(54) METHOD AND SYSTEM FOR A PROCESS SENSOR TO COMPENSATE SOC PARAMETERS IN THE PRESENCE OF IC PROCESS MANUFACTURING VARIATIONS

(75) Inventors: Stephen Chi-Wang Au, San Diego, CA (US); Arya Behzad, Poway, CA (US); Paul Chang, Ladera Ranch, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/545,580

(22) Filed: Jul. 10, 2012

(65) Prior Publication Data

US 2012/0274397 A1    Nov. 1, 2012

Related U.S. Application Data

(63) Continuation of application No. 11/618,900, filed on Dec. 31, 2006, now Pat. No. 8,237,492.

(60) Provisional application No. 60/868,818, filed on Dec. 6, 2006.

(51) Int. Cl.
*G05F 3/02* (2006.01)

(52) U.S. Cl.
USPC .............. 327/538; 327/362; 327/539

(58) Field of Classification Search
USPC .................. 327/362, 100, 538–541
See application file for complete search history.

(56) References Cited

U.S. PATENT DOCUMENTS

| 5,359,552 | A |   | 10/1994 | Dhong et al. |
|---|---|---|---|---|
| 5,774,013 | A | * | 6/1998 | Groe ............................. 327/543 |
| 7,148,672 | B1 | * | 12/2006 | Holmes ......................... 323/316 |
| 7,728,575 | B1 | * | 6/2010 | Ozalevli et al. ............... 323/313 |
| 7,911,223 | B2 |   | 3/2011 | Kim et al. |
| 8,237,492 | B2 | * | 8/2012 | Au et al. ....................... 327/538 |

* cited by examiner

*Primary Examiner* — Dinh T. Le
(74) *Attorney, Agent, or Firm* — Thomas|Horstemeyer, LLP

(57) ABSTRACT

Certain aspects of a method and system for a process sensor to compensate SoC parameters in the presence of IC process manufacturing variations are disclosed. Aspects of one method may include determining an amount of process variation associated with at least one transistor within a single integrated circuit. The determined amount of process variation may be compensated by utilizing a process dependent current, a bandgap current, and a current associated with a present temperature of the transistor. The process dependent current, the bandgap current and the current associated with the present temperature of the transistor may be combined to generate an output current. A voltage generated across a variable resistor may be determined based on the generated output current.

20 Claims, 7 Drawing Sheets

METHOD AND SYSTEM FOR A PROCESS SENSOR TO COMPENSATE SOC PARAMETERS IN THE PRESENCE OF IC PROCESS MANUFACTURING VARIATIONS

CROSS-REFERENCE TO RELATED APPLICATIONS/INCORPORATION BY REFERENCE

This application is a continuation of U.S. application Ser. No. 11/618,900, filed on Dec. 31, 2006, which makes reference to, claims priority to, and claims the benefit of U.S. Provisional Application Ser. No. 60/868,818, filed on Dec. 6, 2006.

The above stated applications are hereby incorporated herein by reference in their entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing signals. More specifically, certain embodiments of the invention relate to a method and system for a process sensor to compensate SoC parameters in the presence of IC process manufacturing variations.

BACKGROUND OF THE INVENTION

The development and design of radio receivers, transmitters, and/or transceiver systems has been driven by the great demand for devices for mobile wireless communication applications, especially handset devices. With the ever decreasing size of mobile handsets and an ever increasing demand for voice, data, and/or video processing capabilities, there is a growing need to develop radio receivers and transmitters that not only meet these challenging performance requirements, but that do so in smaller integrated circuit (IC) footprints, that is, at lower cost, and with greater power efficiency. One approach that aims at addressing these demands is the development of highly integrated receivers, transmitters, and/or transceivers in complementary metal oxide semiconductor (CMOS) technology to minimize the number of off-chip components.

As a result of these highly integrated systems, radio receivers, transmitters, and/or transceivers may comprise a large number of components and/or circuits, which may be utilized for the processing of signals. The design of optimal systems may require that these components and/or circuits operate within certain requirements or constraints for a wide range of operational conditions. For example, power amplifiers (PA) and/or low noise amplifiers (LNA) may be required to operate at an optimal gain level. However, this gain level may vary significantly based on operational conditions, such as temperature and/or voltage supplies, or based on manufacturing conditions, such as the non-uniformity in transistor parameters that result from normal variations in the manufacturing process. These variations generally referred to as process, voltage, and temperature (PVT) variations, may have a significant effect in the overall performance of wireless handsets.

In systems based on the global system for mobile communications (GSM) standard, for example, PVT variations in many of the circuits and/or components utilized in the receiver or the transmitter may produce errors in the generation of "I" (in-phase) and "Q" (quadrature) signal components. These errors may result in a significant degradation in the signal-to-noise ratio (SNR) and/or the bit-error-rate (BER) performance of GSM handsets.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a process sensor to compensate SoC parameters in the presence of IC process manufacturing variations, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a process sensor to compensate SoC parameters in the presence of IC process manufacturing variations. Certain aspects of the invention may comprise determining an amount of process variation associated with at least one transistor within a single integrated circuit. The determined amount of process variation may be compensated by utilizing a process dependent current, a bandgap current, and a current associated with a present temperature of the transistor. The process dependent current, the bandgap current and the current associated with the present temperature of the transistor may be combined to generate an output current. A voltage generated across a variable resistor may be determined based on the generated output current.

Figure 1:
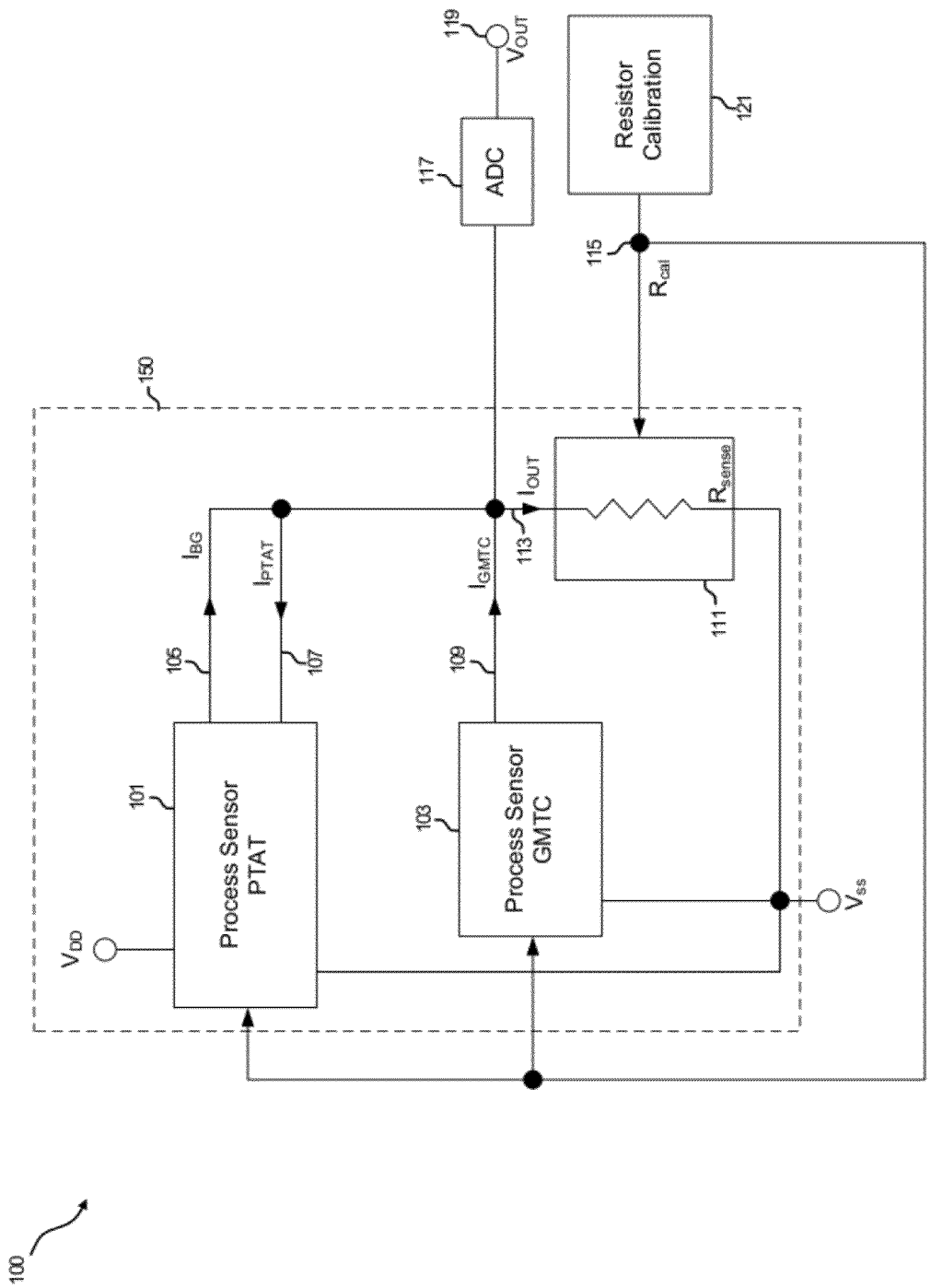
FIG. 1 is a block diagram illustrating an exemplary process sensor in accordance with an embodiment of the invention.

FIG. 1 is a block diagram of a process sensor in accordance with an embodiment of the invention. Referring to FIG. 1, there is shown a single integrated chip 100 comprising a process sensor 150, an analog to digital converter (ADC) 117 and a resistor calibration block 121. The process sensor 150 may comprise a process sensor PTAT block 101, a process sensor GMTC block 103 and a sense resistor block 111. The outputs of the process sensor PTAT block 101 may be coupled to the output of process sensor GMTC block 103, to one terminal of the sense resistor block 111 and to an input of the ADC 117. The output of the resistor calibration block 121 may be coupled to an input of each of the process sensor PTAT block 101, the process sensor GMTC block 103, and the sense resistor block 111. The other terminal of the sense resistor block 111, as well as the process sensor PTAT block 101 and the process sensor GMTC block 103, may be coupled to the negative supply voltage, $V_{SS}$.

The process sensor PTAT block 101 may comprise suitable circuitry, logic and/or code for generating the output bandgap currents $I_{BG}$ 105 and $I_{PTAT}$ 107. The sensor PTAT block 101 may be enabled to receive as an input, the signal $R_{cal}$ 115 which may be utilized to adjust the current $I_{PTAT}$ 107 and its temperature dependence. The bandgap current $I_{BG}$ 105 may be independent of temperature and may have a positive polarity with respect to the process sensor PTAT block 101. The current $I_{PTAT}$ 107 may be proportional to the absolute temperature (PTAT) of the single integrated chip 100 and may have a negative polarity with respect to the process sensor PTAT block 101.

The process sensor GMTC block 103 may comprise suitable circuitry, logic and/or code for generating the output current $I_{GMTC}$ 109. The process sensor GMTC block 103 may be enabled to receive as an input, the signal $R_{cal}$ 115, which may be utilized to adjust the current IGMTC 109. The current $I_{GMTC}$ 109 may be a process dependent current in that it may differ from lot to lot depending on the process utilized to manufacture the chip. The transconductance of the transistors in a chip, described further with respect to FIG. 2, may be a nominal value, or may vary higher or lower than the nominal value determined by the manufacturing process. This may lead to variable chip performance and the on-chip measurement of this variation may be the objective of this invention.

The ADC 117 may comprise suitable circuitry, logic and/or code for converting an analog signal to a digital output. The ADC 117 may be enabled to receive an input signal, namely the voltage defined by the current $I_{OUT}$ 113 multiplied by the resistance, $R_{sense}$, of the sense resistor block 111. The ADC 117 may be enabled to generate a digital output signal, which may comprise the process sensor output $V_{OUT}$ 119.

The resistor calibration block 121 may comprise suitable circuitry, logic and/or code for calibrating the sense resistor block 111 as well as resistances in the process sensor PTAT block 101 and the process sensor GMTC block 103. The resistor calibration block 121 may be further described with respect to FIG. 3.

In instances where the transconductance is higher than nominal, the current $I_{GMTC}$ 109 may be lower than a nominal value and in instances where the transconductance is lower than nominal, the current $I_{GMTC}$ 109 may be higher than a nominal value. The current $I_{GMTC}$ 109 may also be temperature dependent, similar to current $I_{PTAT}$ 107, and may have a larger variation than the process variation.

In operation, since both currents, $I_{PTAT}$ 107 and $I_{GMTC}$ 109, may have similar temperature coefficients, current $I_{PTAT}$ 107 may be subtracted from $I_{GMTC}$ 109, effectively cancelling out the temperature variation. Also, since this difference, $I_{GMTC}$ 109–$I_{PTAT}$ 107, may be negative, the temperature independent current $I_{BG}$ 105 may be added to result in a positive current $I_{OUT}$ 113. This relationship is illustrated by the following equation:

$$I_{OUT} = I_{GMTC} - I_{PTAT} + I_{BG}$$

Figure 4:
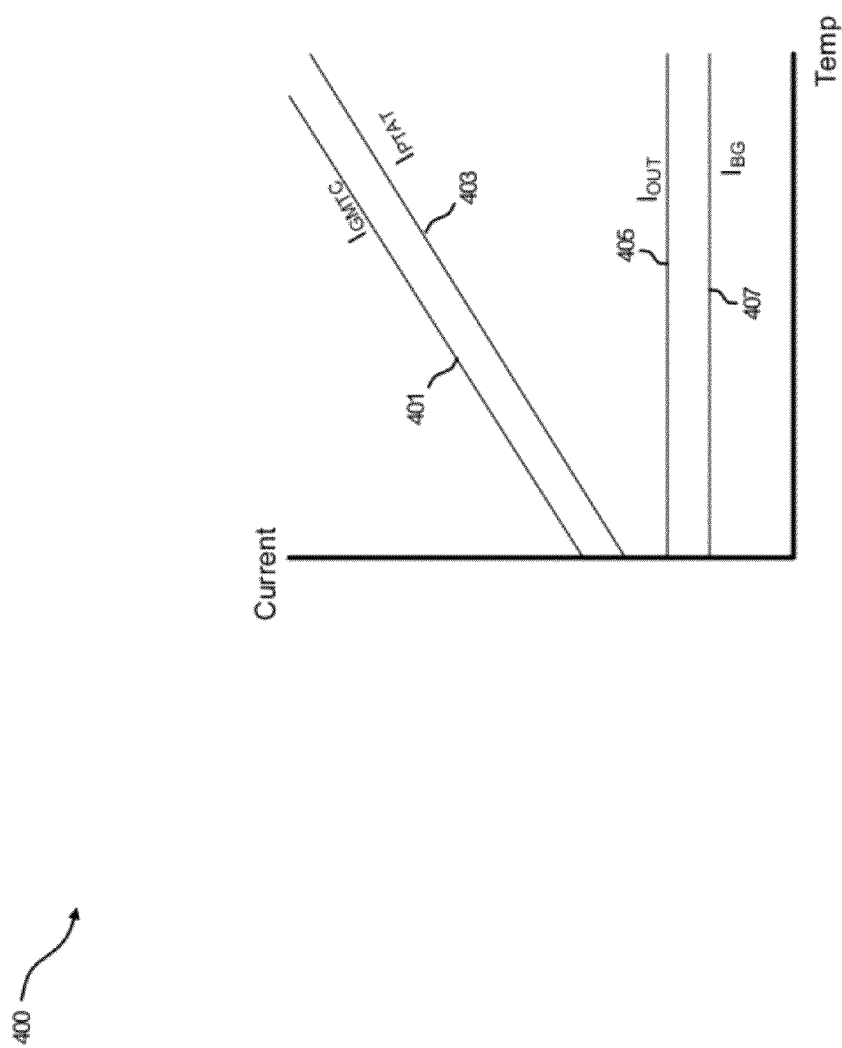
FIG. 4 is a block diagram illustrating exemplary current versus temperature in accordance with an embodiment of the invention.

This equation may be further described with respect to FIG. 4.

The current $I_{OUT}$ 113 may flow through sense resistor block 111 generating an analog output voltage 123. The sense resistor block 111 may comprise a variable resistance that may be determined utilizing the signal $R_{cal}$ 115 generated by the resistor calibration block 121, described further with respect to FIG. 3.

Figure 2:
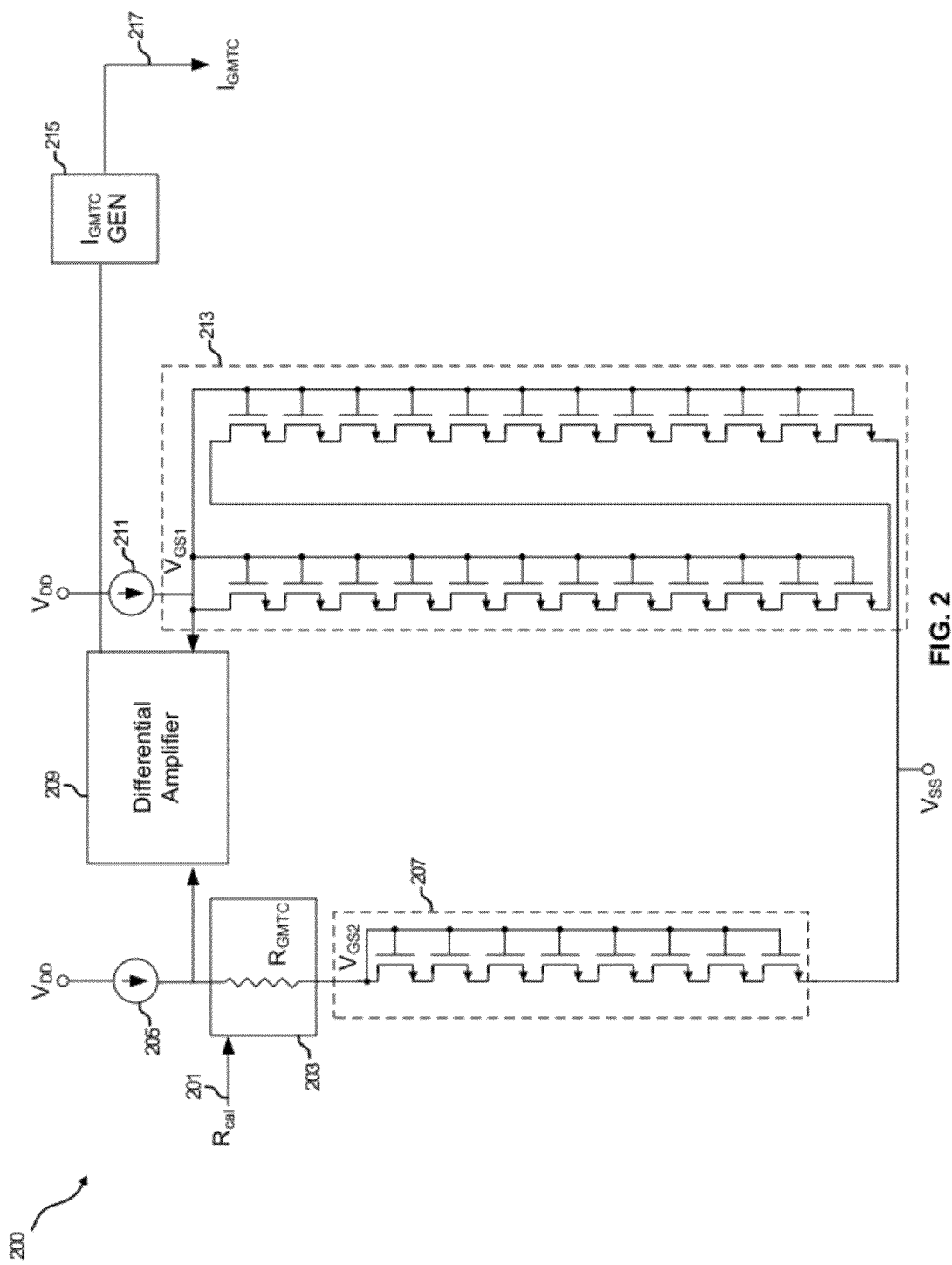
FIG. 2 is a block diagram illustrating an exemplary process-sensitive current source, in accordance with an embodiment of the invention.

FIG. 2 is a block diagram of a process-sensitive current source, in accordance with an embodiment of the invention. Referring to FIG. 2, there is shown $I_{GMTC}$ source 200 comprising current sources 205 and 211, a GMTC resistance block 203, a $V_{GS1}$ transistor block 213, a $V_{GS2}$ transistor block 207, a differential amplifier 209, and a programmable current source 215. The GMTC resistance block 203 may comprise a programmable variable resistor that may be enabled to adjust the current through the $V_{GS2}$ transistor block 207. The $V_{GS1}$ transistor block 213 and the $V_{GS2}$ transistor block 207 may comprise serially connected MOS transistors, with each gate coupled to the drain of the first transistor, and the last transistor coupled to the negative supply, $V_{SS}$. The $V_{GS1}$ transistor block 213 and the $V_{GS2}$ transistor block 207 may be enabled to determine a process variation in the single integrated chip 100, described with respect to FIG. 1.

The programmable current source 215 may generate a current $I_{GMTC}$ 217 which may be proportional to the process dependent currents in the current sources 205 and 211. The current scaling factor may be determined by a digital input signal that may comprise one or more bits, and may represent a numerical value.

The positive terminal of the current source 205 may be coupled to the positive supply voltage $V_{DD}$, and the negative terminal may be coupled to the first terminal of the GMTC resistance block 203. The second terminal of the GMTC resistance block 203 may be coupled to the drain terminal of the $V_{GS2}$ transistor block 207, as well as to the gate of each of the transistors in the $V_{GS2}$ transistor block 207. The source terminal of the $V_{GS2}$ transistor block 207 may be coupled to the negative power supply, $V_{SS}$. The first terminal of the GMTC resistance block 203 may be coupled to the differential amplifier 209. The positive terminal of the current source 211 may be coupled to the positive supply voltage $V_{DD}$, and the negative terminal may be coupled to the drain terminal of the $V_{GS1}$ transistor block 213 and to the gate of each of the transistors in the $V_{GS1}$ transistor block 213. The drain terminal of the $V_{GS1}$ transistor block 213 may also be coupled to another input of the differential amplifier 209. The output of the differential amplifier 209 may be coupled to the programmable current source 215.

In operation, the $I_{GMTC}$ source 200 may generate a current $I_{GMTC}$ 217 that may be dependent on temperature as well as process variations from the single integrated chip 100 manufacturing process. The differential amplifier may sense the voltage across the two transistor blocks, the $V_{GS1}$ transistor block 213 and the $V_{GS2}$ transistor block 207, and communicate the resulting signal to the programmable current source 215. The output of the programmable current source 215 may comprise the current $I_{GMTC}$ 217.

The process variations in the transistors in the $V_{GS1}$ transistor block 213 and/or the $V_{GS2}$ transistor block 207 may be utilized to sense the process variation in the single integrated chip 100, described with respect to FIG. 1.

Figure 3:
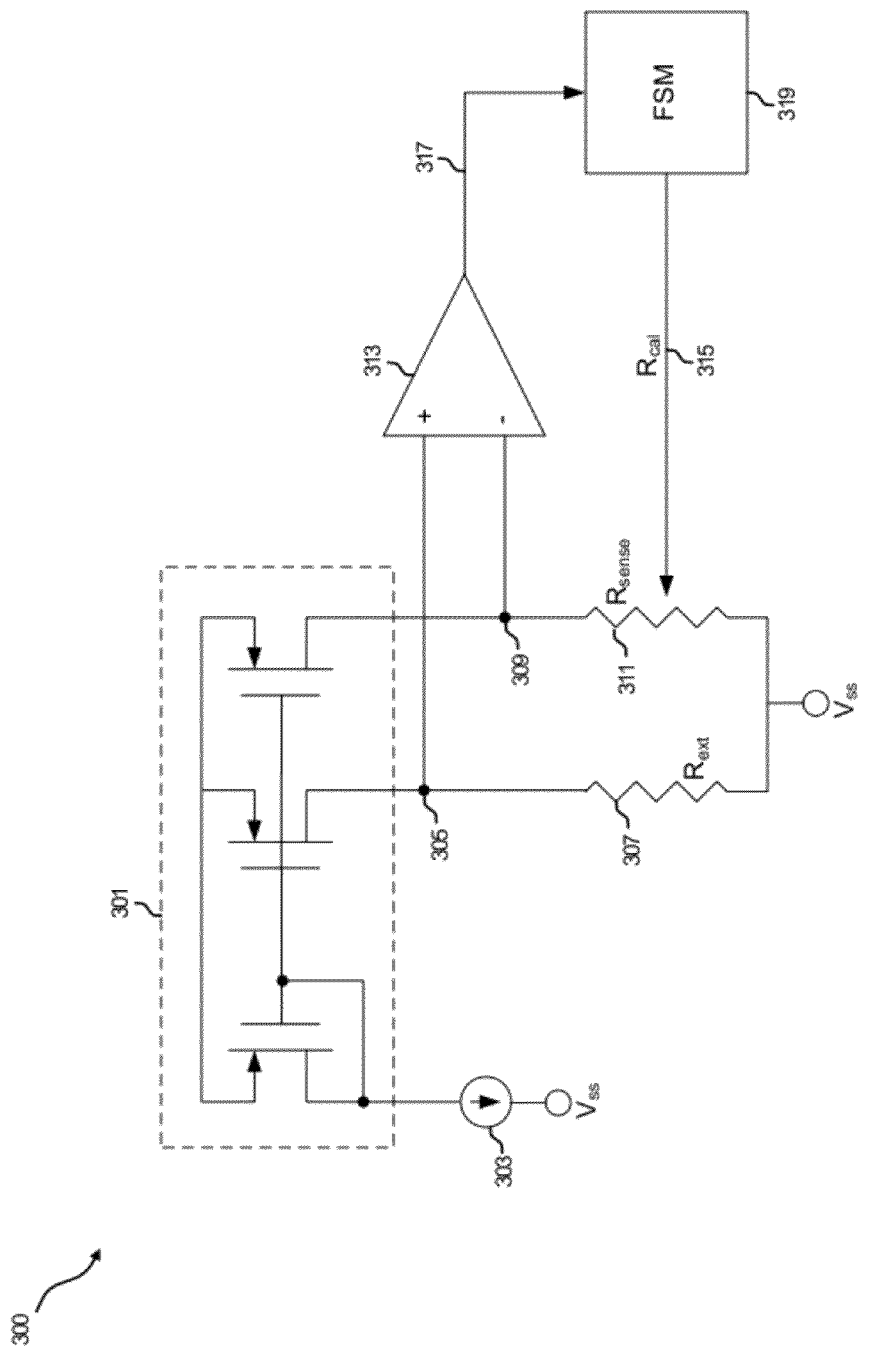
FIG. 3 is a block diagram illustrating an exemplary resistor calibration circuit, in accordance with an embodiment of the invention.

FIG. 3 is a block diagram illustrating an exemplary resistor calibration circuit, in accordance with an embodiment of the invention. Referring to FIG. 3, there is shown resistor calibration circuit 300 comprising a current mirror 301, a current source 303, an external resistor $R_{ext}$ 307, a sense resistor $R_{sense}$ 311, a comparator 313, and a finite state machine (FSM) 319. The sense resistor may be substantially similar to the sense resistor block 111 as well as resistances in the process sensor PTAT block 101 and the process sensor GMTC block 103 described with respect to FIG. 1.

The current source 303 may be enabled to generate a current that may be mirrored to two output terminals of the current mirror 301, each coupled to one terminal of the sense resistors, $R_{sense}$ 311 and $R_{ext}$ 307. The external sense resistor, $R_{ext}$ 307 may be a known, accurate value resistance. The other terminal of the current source 303 may be coupled to a negative supply voltage $V_{SS}$. The current mirror 301 may be enabled to receive as an input, the current generated by the current source 303 and generate similar output currents at the outputs of the current mirror 301. The other terminals of the sense resistors, $R_{sense}$ 311 and $R_{ext}$ 307, may be coupled to the negative supply voltage $V_{SS}$. The output terminals of the current mirror 301 may also be coupled to the inputs of the comparator 313. The output of the comparator 313 may be coupled to the input of the FSM 319. The comparator 313 may be enabled to compare the voltages across the sense resistors, $R_{sense}$ 311 and $R_{ext}$ 307, and generate an output signal that may be a function of the difference in voltage across the sense resistors $R_{sense}$ 311 and $R_{ext}$ 307. The FSM 319 may be enabled to receive as an input the output generated by the comparator 313 and generate an output signal, $R_{cal}$ 315, that may adjust a resistance value of the sense resistor, $R_{sense}$ 311.

In operation, the difference in voltage across the sense resistors, $R_{sense}$ 311 and $R_{ext}$ 307, may be compared by the comparator 313. The output signal of the comparator 313 may be communicated to the FSM 319. The FSM 319 may adjust the internal sense resistor, $R_{sense}$ 311, until the voltage across the two resistors may be equal. In this manner, the internal sense resistor, $R_{sense}$ 311, may be accurately calibrated.

FIG. 4 is a block diagram illustrating exemplary current versus temperature in accordance with an embodiment of the invention. Referring to FIG. 4, the y-axis comprises current and the x-axis comprises temperature. The currents shown comprise $I_{GMTC}$ 401, $I_{PTAT}$ 403, $I_{OUT}$ 405 and $I_{BG}$ 407. As described with respect to FIG. 1, the temperature variation of the output current $I_{OUT}$ 405 may be mitigated by subtracting $I_{PTAT}$ 403 from $I_{GMTC}$ 401. To ensure that the output current may be positive, the current $I_{BG}$ 407 may be summed with $I_{GMTC}$ 401–$I_{PTAT}$ 403, and the resulting output current $I_{OUT}$ 405 is shown in the plot. The total current variation due to process variation may be given by the equation:

$$\Delta I_{OUT} = \Delta I_{GMTC} - \Delta I_{PTAT} + \Delta I_{BG}.$$

Since the variation of $I_{PTAT}$ and $I_{BG}$, $\Delta I_{PTAT}$ and $\Delta I_{BG}$, may be small due to their relative insensitivity to process variations, the output current variation $\Delta I_{OUT}$, may be approximately equal to $\Delta I_{GMTC}$.

Figure 5:
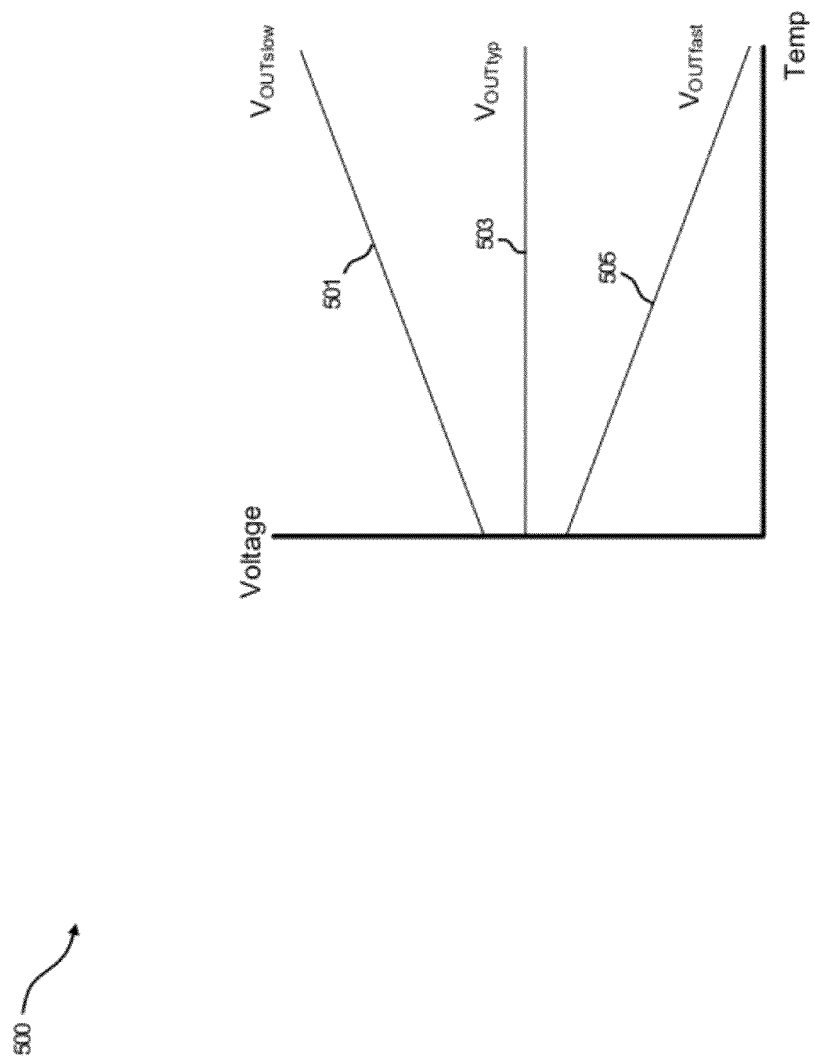
FIG. 5 is a block diagram illustrating exemplary voltage versus temperature, in accordance with an embodiment of the invention.

FIG. 5 is a block diagram illustrating exemplary voltage versus temperature, in accordance with an embodiment of the invention. Referring to FIG. 5, the y-axis comprises voltage and the x-axis comprises temperature. The voltages shown comprise $V_{OUTslow}$ 501, $V_{OUTtyp}$ 503 and $V_{OUTfast}$ 505, and may comprise output voltage $V_{OUT}$ 119 versus temperature generated by the ADC 117, described with respect to FIG. 1.

For optimum process sensor 150 performance, it may be desirable to have constant $V_{OUT}$ 119 over temperature in the typical transistor transconductance case, as described with respect to FIG. 1, but have large variation in instances where the transconductance is higher or lower than typical. This large variation may be achieved by increasing the current $I_{GMTC}$ 401, reducing the $I_{OUT}$ 405, and/or utilizing longer length transistors such as those in the $V_{GS1}$ transistor block 213 and/or the $V_{GS2}$ transistor block 207, described with respect to FIG. 2. Thus, for transistor transconductances that are higher or lower than typical, there may be a large variation in the $V_{OUT}$ 119 generated by the process sensor 150.

Figure 6:
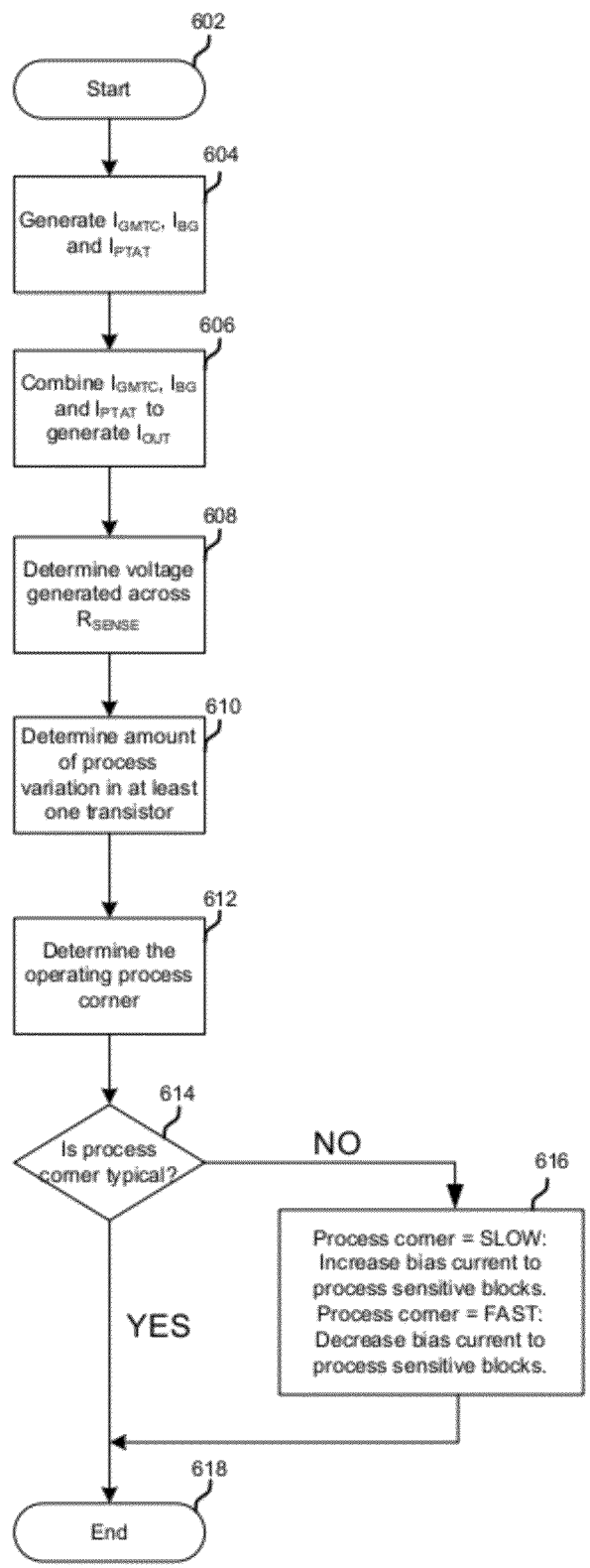
FIG. 6 is a flow chart illustrating exemplary steps for a process sensor utilized to mitigate the effects of process variation in blocks with significant process dependency, in accordance with an embodiment of the invention.

FIG. 6 is a flow chart illustrating exemplary steps for a process sensor utilized to mitigate the effects of process variation in blocks with significant process dependency, in accordance with an embodiment of the invention. Referring to FIG. 6, exemplary steps may begin at step 602. In step 604, the process sensor GMTC 103 may be enabled to generate the process dependent current $I_{GMTC}$ 109 associated with at least one transistor in the $V_{GS1}$ transistor block 213 and/or the $V_{GS2}$ transistor block 207. The process sensor PTAT 101 may be enabled to generate the bandgap current $I_{BG}$ 105 and the current associated with the present temperature $I_{PTAT}$ 107 of at least one transistor such as the transistors in the $V_{GS1}$ transistor block 213 and/or the $V_{GS2}$ transistor block 207. The polarity of the process dependent current $I_{GMTC}$ 109 may be opposite to a polarity of the current associated with the present temperature $I_{PTAT}$ 107 of at least one transistor such as the transistors in the $V_{GS1}$ transistor block 213 and/or the $V_{GS2}$ transistor block 207. In step 606, the process dependent current $I_{GMTC}$ 109, the bandgap current $I_{BG}$ 105, and the current associated with a present temperature of the transistor $I_{PTAT}$ 107, may be combined to generate an output current $I_{OUT}$ 113. In step 608, a voltage $V_{OUT}$ 117 generated across a variable resistor $R_{SENSE}$ 311 may be determined based on the generated output current $I_{OUT}$ 113. In step 610, the amount of process variation associated with at least one transistor in the $V_{GS1}$ transistor block 213 and/or the $V_{GS2}$ transistor block 207 within a single integrated circuit 100 may be determined. In step 612, the particular process corner of operation of the single integrated circuit 100 may be determined based on the determined amount of process variation. In step 614, it may be determined whether the process corner of operation is within a typical range. If the process corner of operation is within a typical range, no change may be necessary, and the control passes to end step 618. If the process corner of operation is not within a typical range, control passes to step 616. The process corner of operation may be either within a fast range or a slow range of operation. In step 616, if the process corner is within a fast (slow) range, the bias current going into a circuit block with significant process dependency may be decreased (increased) through a programmable current source. By keeping the transconductance of the main amplifying transistors within a more narrow range, the process variation of the circuit block may be reduced. Control then passes to end step 618.

Figure 7:
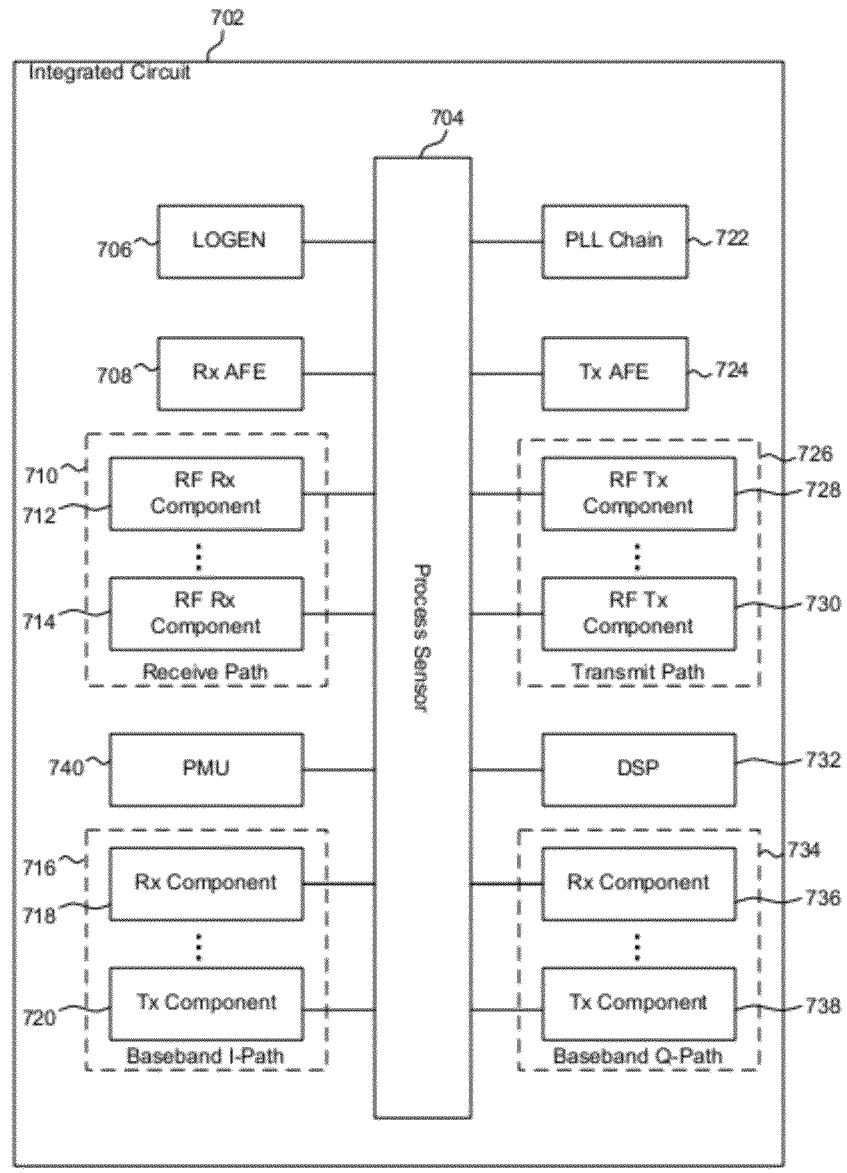
FIG. 7 is a block diagram of an exemplary system comprising a processor sensor that may be utilized to compensate SoC parameters in the presence of IC process manufacturing variations.

FIG. 7 is a block diagram of an exemplary system comprising a processor sensor that may be utilized to compensate SoC parameters in the presence of IC process manufacturing variations. Referring to FIG. 7, there is shown an integrated circuit 702 comprising a plurality of exemplary on-chip components. The plurality of exemplary components may comprise a local oscillator generation (LOGEN) circuit 706, a receiver (Rx) analog front end (AFE) 708, a receive path 710, a power management unit (PMU) 740, and a baseband in-phase (I) path 716. The integrated circuit 702 further comprises a PLL chain 722, a transmit (Tx) analog front end, a transmit path 726, a DSP 732, and a baseband quadrature (Q) path 734. The receive path 710 may comprise a plurality of RF receive components 712, ..., 714. The transmit path 726 may comprise a plurality of RF transmit components 728, ..., 730. The baseband in-phase (I) path 716 may comprise a plurality of baseband processing components 718, ..., 720. For example, the baseband I-path 716 may comprise a receive (Rx) baseband I-path component 718 and a transmit (Tx) baseband I-path component 710. The baseband in-phase (Q) path 734 may comprise a plurality of baseband processing components 736, ..., 738. For example, the baseband Q-path 734 may comprise a receive (Rx) baseband Q-path component 736 and a transmit (Tx) baseband Q-path component 738.

The processor sensor 704 may be enabled to sense process skews for one or more of the components within the integrated circuit 702. In response to the sensing of process skews, the processor sensor 704 may be enabled to adjust one or more process parameters that may be utilized to optimally control operation of one or more of the components within the integrated circuit 702. In an exemplary embodiment of the invention, the process sensor 704 may also be enabled to control one or more of: a bias current, a bandgap current, LO feedthrough, amplifier gain, filter bandwidth, filter Q value, RF amplifier Q compensation value, noise parameters, linearity parameters, VCO gain, PLL bandwidth, of one or more components within the integrated circuit 702. For example, if the RF Tx component 728 is a power amplifier, the processor sensor 704 may be enabled to control a bias current, gain and/or linearity of the RF Tx component 728 in the transmit path 726. In another example, if the RF Rx component 712 is a low noise amplifier (LAN), the processor sensor 704 may be enabled to control a bias current, gain and/or linearity of the RF Rx component 712 in the receive path 710. In another example, the sensor 704 may be enabled to control various operation of the LOGEN 706, the PLL chain 722, the Rx AFE 708, the Tx AFE 724, the PMU 740 and/or the DSP 732 based on the sensing.

Code running on the DSP 732, for example, may determine which process parameters may be adjusted based on results from the sensing performed by the process sensor 704. Responsive to this determination, the process sensor 704 may be enabled to control various parameters for one of more of the components within the integrated circuit 702. In one embodiment of the invention, the operation of the process sensor 704 may be independent of temperature variations. Notwithstanding, the invention is not limited in this regard.

In accordance with an embodiment of the invention, a method and system for a process sensor to compensate SoC parameters in the presence of IC process manufacturing may comprise determining an amount of process variation associated with at least one transistor, for example, a transistor in the $V_{GS1}$ transistor block 213 and/or the $V_{GS2}$ transistor block 207 within a single integrated circuit 100. The amount of process variation may be compensated by utilizing a process dependent current $I_{GMTC}$ 109, a bandgap current $I_{BG}$ 105, and a current associated with a present temperature of the transistor $I_{PTAT}$ 107. The process dependent current $I_{GMTC}$ 109, the bandgap current $I_{BG}$ 105, and the current associated with a present temperature of the transistor $I_{PTAT}$ 107, may be combined to generate an output current $I_{OUT}$ 113. A voltage $V_{OUT}$ 119 generated across a variable resistor, sensor resistor block 111, may be determined based on the generated output current $I_{OUT}$ 113. The resistor calibration block 121 may be enabled to calibrate the variable resistor sensor resistor block 111 based on an external precision resistor 307. The ADC 117 may be enabled to convert the determined voltage to a digital signal, $V_{OUT}$ 119. The polarity of the process dependent current $I_{GMTC}$ 109 may be opposite to a polarity of the current associated with the present temperature $I_{PTAT}$ 107 of at least one transistor in the $V_{GS1}$ transistor block 213 and/or the $V_{GS2}$ transistor block 207.

Another embodiment of the invention may comprise one or more process sensors such as process sensor 704 integrated within a single integrated circuit 702 that senses one or more process parameters associated with process skews and adjusts one or more parameters that controls one or more circuits within the single integrated circuit 702 based on the sensing of the one or more process parameters. The process sensor integrated 704 with the single integrated circuit 702 may control one or more components in at least one of: an in-phase processing path 716, and a quadrature processing path 734. The process sensor 704 may also be enabled to control one or more of: a bias current, a bandgap current, LO feedthrough, amplifier gain, filter bandwidth, filter Q value, RF amplifier Q compensation value, noise parameters, linearity parameters, VCO gain, PLL bandwidth, of one or more RF processing components integrated with said single integrated circuit 702. The one or more RF processing components may be located in a receive RF processing chain 710, in a transmit RF processing chain 726, in a PLL chain 722, a LOGEN circuit or chain 706, a receive AFE 708, a Tx AFE 724, a PMU and/or a DSP 732.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method implemented in a single integrated circuit (IC), comprising:
   generating a process dependent current associated with a transistor in the single IC, wherein the process dependent current corresponds to a process utilized for manufacturing the single IC;
   generating a bandgap current associated with the transistor;
   generating a current based on a current temperature of the transistor;
   generating an output current based on each of: the process dependent current, the bandgap current, and the current based on the current temperature; and
   compensating for an amount of process variation associated with the single IC based on a voltage generated across a variable resistor implemented within the single IC based on the output current, wherein the variable resistor is adjusted according to a calibration signal output by a finite state machine (FSM).

2. The method of claim 1, wherein the variable resistor is adjusted based on an external precision resistor.

3. The method of claim 1, further comprising converting the determined voltage to a digital signal utilizing an analog-to-digital converter.

4. The method of claim 1, wherein the process dependent current is based on a variation in transconductance of the transistor.

5. The method of claim 4, further comprising determining whether a process corner of operation of the single IC corresponds to a fast range, a typical range, or a slow range of operation based on the variation in transconductance.

6. The method of claim 1, wherein a polarity of the process dependent current is opposite of a polarity of the current associated with the present temperature of the transistor.

7. A system in a single integrated circuit (IC), comprising:
   a first process sensor configured to output a bandgap current and a current proportional to an absolute temperature;
   a sense resistor comprising a variable resistor;
   a second process sensor configured to output a process dependent current, the second process sensor being coupled to the first process sensor and the variable resistor, wherein the variable resistor is configured to receive an output current based on the bandgap current, the current proportional to an absolute temperature, and the process dependent current; wherein the sense resistor is configured to generate an output voltage based on the output current; and
   a calibration circuit configured to adjust the sense resistor utilizing a calibration signal generated according to a comparison of voltages across a precision resistor and the sense resistor.

8. The system of claim 7, wherein the calibration signal is output by a finite state machine (FSM), wherein the FSM is configured to output the calibration signal according to the comparison of voltages.

9. The system of claim 8, wherein the FSM is configured to adjust the sense resistor such that the voltages across the precision resistor and the sense resistor are approximately equal.

10. The system of claim 7, wherein the calibration circuit is coupled directly to the sense resistor, the first process sensor, and the second process sensor.

11. The system of claim 10, wherein the calibration circuit is configured to calibrate the sense resistor and resistances associated with the first and second process sensors.

12. The system of claim 7, wherein the bandgap current, the current proportional to an absolute temperature, and the process dependent current are combined to generate the output current.

13. The system of claim 7, wherein the precision resistor is external to the single IC.

14. A method implemented in a single integrated circuit (IC), comprising:
   generating a process dependent current associated with a transistor in the single IC, wherein the process dependent current corresponds to a transconductance of the transistor;
   generating a bandgap current associated with the transistor;
   generating a current based on a current temperature of the transistor;
   generating an output current based on each of: the process dependent current, the bandgap current, and the current based on the current temperature; and
   compensating for an amount of process variation associated with the single IC based on a voltage generated across a variable resistor implemented within the single IC based on the output current.

15. The method of claim 14, wherein the variable resistor is adjusted according to a calibration signal output by a finite state machine (FSM).

16. The method of claim 14, further comprising adjusting a value of the variable resistor based on an external precision resistor.

17. The method of claim 14, further comprising characterizing a process corner of operation associated with the single IC based on the output current.

18. The method of claim 17, wherein characterizing the process corner of operation comprises:
   generating an output voltage based on the output current and the variable resistor; and
   generating a digital output signal corresponding to the output voltage.

19. The method of claim 14, wherein a polarity of the process dependent current is opposite of a polarity of the current associated with the current temperature of the transistor.

20. The method of claim 14, wherein the output current is generated by combining the process dependent current, the bandgap current, and the current based on the current temperature.

* * * * *